United States Patent
Hashimoto

(10) Patent No.: US 9,252,137 B2
(45) Date of Patent: Feb. 2, 2016

(54) SEMICONDUCTOR SUBSTRATE AND SEMICONDUCTOR CHIP

(71) Applicant: RENESAS ELECTRONICS CORPORATION, Kanagawa (JP)

(72) Inventor: Takayuki Hashimoto, Naka-gun (JP)

(73) Assignee: Renesas Electronics Corporation, Tokyo (JP)

(*) Notice: Subject to any disclaimer, the term of this patent is extended or adjusted under 35 U.S.C. 154(b) by 0 days.

(21) Appl. No.: 14/474,384

(22) Filed: Sep. 2, 2014

(65) Prior Publication Data

US 2014/0367685 A1 Dec. 18, 2014

Related U.S. Application Data

(62) Division of application No. 13/803,613, filed on Mar. 14, 2013, now Pat. No. 8,841,720, which is a division of application No. 13/048,938, filed on Mar. 16, 2011, now Pat. No. 8,502,304.

(30) Foreign Application Priority Data

Mar. 18, 2010 (JP) .................................. 2010-62141

(51) Int. Cl.

| | |
|---|---|
| *H01L 29/861* | (2006.01) |
| *H01L 25/16* | (2006.01) |
| *H01L 23/495* | (2006.01) |
| *H01L 25/07* | (2006.01) |
| *H01L 29/739* | (2006.01) |
| *H01L 27/06* | (2006.01) |
| *H01L 23/00* | (2006.01) |

(52) U.S. Cl.
CPC ........ *H01L 25/162* (2013.01); *H01L 23/49562* (2013.01); *H01L 23/49575* (2013.01);
(Continued)

(58) Field of Classification Search
CPC ......... H01L 25/16; H01L 27/06; H01L 23/00; H01L 29/861; H01L 29/739; H01L 23/58
USPC .......... 257/48, 330, 139, 335, 337, 570, 341, 257/328, 2, 379, 380, 536, 541, 542, 543
See application file for complete search history.

(56) References Cited

U.S. PATENT DOCUMENTS

| 4,612,629 A | 9/1986 | Harari |
| 5,306,937 A | 4/1994 | Nishimura |
| (Continued) | | |

FOREIGN PATENT DOCUMENTS

| JP | 5-75131 A | 3/1993 |
| JP | 2004-312913 A | 11/2004 |
| (Continued) | | |

OTHER PUBLICATIONS

Japanese Office Action received in Japanese Application No. 2010-062141 dated Dec. 24, 2013.

*Primary Examiner* — Chuong A Luu
(74) *Attorney, Agent, or Firm* — Mattingly & Malur, PC

(57) ABSTRACT

A semiconductor substrate capable of detecting operating current of a MOSFET and diode current in a miniaturized MOSFET such as a trench-gate type MOSFET is provided. A semiconductor substrate includes a main current region and a current sensing region in which current smaller than the main current flowing in the main current region flows. The main current region has a source electrode disposed on a main surface, the source electrode being in contact with a p-type semiconductor region (body) and an $n^+$-type semiconductor region (source), and the current sensing region has a MOSFET current detecting electrode and a diode current detecting electrode on a main surface, the MOSFET current detecting electrode being in contact with the p-type semiconductor region (body) and the $n^+$-type semiconductor region (source), the diode current detecting electrode being in contact with the p-type semiconductor region (body).

4 Claims, 9 Drawing Sheets

(52) U.S. Cl.
CPC .............. *H01L24/49* (2013.01); *H01L 25/072* (2013.01); *H01L 25/16* (2013.01); *H01L 27/0629* (2013.01); *H01L 29/7397* (2013.01); *H01L 29/861* (2013.01); *H01L 24/48* (2013.01); *H01L 2224/48137* (2013.01); *H01L 2224/48247* (2013.01); *H01L 2224/4903* (2013.01); *H01L 2224/49111* (2013.01); *H01L 2224/49175* (2013.01); *H01L 2924/13091* (2013.01); *H01L 2924/14* (2013.01); *H01L 2924/19041* (2013.01); *H01L 2924/19043* (2013.01)

(56) References Cited

U.S. PATENT DOCUMENTS

| | | |
|---|---|---|
| 2004/0252435 A1 | 12/2004 | Ishikawa et al. |
| 2005/0218489 A1* | 10/2005 | Satou et al. .................. 257/678 |
| 2007/0030615 A1 | 2/2007 | Ishikawa et al. |
| 2007/0145580 A1 | 6/2007 | Satou et al. |
| 2009/0128974 A1 | 5/2009 | Ishikawa et al. |
| 2009/0218683 A1 | 9/2009 | Satou et al. |
| 2010/0141229 A1 | 6/2010 | Satou et al. |
| 2011/0024608 A1 | 2/2011 | Assefa et al. |
| 2011/0215381 A1 | 9/2011 | Masuoka et al. |
| 2011/0273154 A1 | 11/2011 | Satou et al. |
| 2011/0312166 A1 | 12/2011 | Yedinak et al. |
| 2012/0139130 A1 | 6/2012 | Satou et al. |
| 2013/0203217 A1 | 8/2013 | Satou et al. |
| 2014/0003002 A1 | 1/2014 | Satou et al. |

FOREIGN PATENT DOCUMENTS

| | | |
|---|---|---|
| JP | 2005-006381 A | 1/2005 |
| JP | 2005-294464 A | 10/2005 |
| JP | 2006-310473 A | 11/2006 |
| JP | 2007-14059 A | 1/2007 |
| JP | 2009-099690 A | 5/2009 |

* cited by examiner

SEMICONDUCTOR SUBSTRATE AND SEMICONDUCTOR CHIP

CROSS-REFERENCE TO RELATED APPLICATIONS

This is a divisional application of U.S. Ser. No. 13/803,613, filed Mar. 14, 2013 now U.S. Pat. No. 8,841,720, which is a divisional application of U.S. Ser. No. 13/048,938, filed Mar. 16, 2011 (now U.S. Pat. No. 8,502,304), which claims priority from Japanese Patent Application No. 2010-62141 filed on Mar. 18, 2010, the content of both applications is hereby incorporated by reference into this application.

BACKGROUND

The present invention relates to a switching circuit of a switched-mode power supply device. More specifically, the present invention relates to a semiconductor substrate, a semiconductor chip and a semiconductor device used in a switching circuit.

There is an existing technology of reducing conduction loss by shortening a conducting period of a body diode being parasitic to a low-side MOSFET of a synchronous rectifying device in a feedback period in which a high-side MOSFET of a main switching device is off (for example, Japanese Patent Application Laid-Open Publication No. 2004-312913 (Patent Document 1)).

According to Patent Document 1, not to cause large through current to occur when a high-side MOSFET of a main switching device and a low-side MOSFET of asynchronous rectifying device are turned on at the same time, the high-side MOSFET and the low-side MOSFET are alternately turned on and off with dead time provided to gate voltage signals.

According to Patent Document 1, by control for making the dead time of the turning on and off the MOSFETs, a conducting period of a body diode parasitic to the low-side MOSFET in a feedback period in which the high-side MOSFET is on is shortened, thereby reducing conduction loss.

As a voltage to be applied to the body diode of the low-side MOSFET is switched from a forward voltage to a reverse voltage upon turning on the high-side MOSFET, reverse current from a cathode to an anode, that is, recovery current flows in the body diode for a moment, thereby causing recovery loss to occur.

To reduce the recovery loss, it has been known that crossing a high-side MOSFET and a low-side MOS is effective (for example, Japanese Patent Application Laid-Open Publication No. 2007-14059 (Patent Document 2)). However, if the switching timing is crossed too much, there is a problem that large through current flows.

According to Patent Document 1, there is a limitation not to flow the through current at all, and thus the switching cannot be crossed for reducing the recovery loss. According to Patent Document 2, with preventing large through current from flowing, the switching of the high-side MOSFET and the low-side MOSFET is crossed, thereby reducing the recovery loss.

The switching circuit of Patent Document 2 includes first current detecting means which detects current flowing in the low-side MOSFET and second current detecting means which detects current flowing in the body diode of the low-side MOSFET, in which dead time is set to make both through current detected by the first current detecting means and recovery current of the body diode detected by the second current detecting means small, and gate signals to the high-side MOSFET and the low-side MOSFET are outputted. In this manner, as well as reducing recovery loss by flowing the through current, large through current is prevented from flowing.

However, in a generally used MOSFET, a source electrode is in contact with both a p-type body region and an $n^+$-type source region, and thus it is difficult to independently detect operating current of the MOSFET and current flowing in the body diode.

According to Japanese Patent Application Laid-Open Publication No. 5-75131 (Patent Document 3), there is a problem that operating current of a MOSFET cannot be independently detected while it is possible to independently detect current flowing in a body diode.

To solve this problem, according to Japanese Patent Application Laid-Open Publication No. 2006-310473 (Patent Document 4), structures of a sensing MOSFET and a sensing diode capable of independently detecting operating current of a MOSFET and current flowing in a parasitic diode are suggested.

SUMMARY

Meanwhile, the sensing MOSFET and the sensing diode described in Patent Document 4 have their electrodes split in two on a surface of a semiconductor substrate and one of the split electrodes (electrode of the sensing MOSFET) is connected to an $n^+$-type source region, and the other one (the sensing diode) is connected to a p-type body region, and thus, while it is able to use the sensing MOSFET and sensing diode to a planer-type MOSFET, there has been a problem of difficulty in using them to a miniaturized MOSFET such as a trench-gate type MOSFET.

Accordingly, preferred aims of the present invention are to solve the problems in above-mentioned existing technologies, and to provide a semiconductor substrate, a semiconductor chip and a semiconductor device capable of detecting operating current of a MOSFET and diode current in a miniaturized MOSFET such as a trench-gate type MOSFET.

The above and other preferred aims and novel characteristics of the present invention will be apparent from the descriptions of the present specification and the accompanying drawings.

The typical ones of the inventions disclosed in the present application will be briefly described as follows.

More specifically, as a brief summary of the typical one of the inventions, a semiconductor substrate includes: a first semiconductor region on a main surface of a substrate; a second semiconductor region formed in the first semiconductor region and having a conductivity opposite to that of the first semiconductor region; and a third semiconductor region formed in the second semiconductor region and having the same conductivity as the first semiconductor region, the semiconductor substrate having a main current region and a current detecting region in which current smaller than main current flowing in the main current region flows, in which the main current region has a second conductor disposed on a main surface of the main current region, the second conductor being in contact with the second semiconductor region and the third semiconductor region, and the current detecting region has a third conductor and a fourth conductor disposed on a main surface of the current detecting region, the third conductor being in contact with the second semiconductor region and the third semiconductor region, the fourth conductor being in contact with the second conductor.

The effects obtained by typical aspects of the present invention will be briefly described below.

More specifically, an effect obtained by the typical one of the present inventions is that operating current of a MOSFET and diode current can be detected in a miniaturized MOSFET such as a trench-gate type MOSFET, and therefore it is possible to achieve low loss and low noise in a switching circuit of a power supply etc.

DETAILED DESCRIPTION

Hereinafter, embodiments of the present invention will be described in detail with reference to the accompanying drawings. Note that components having the same function are denoted by the same reference symbols throughout the drawings for describing the embodiment, and the repetitive descriptions thereof will be omitted.

First Embodiment

Figure 1:
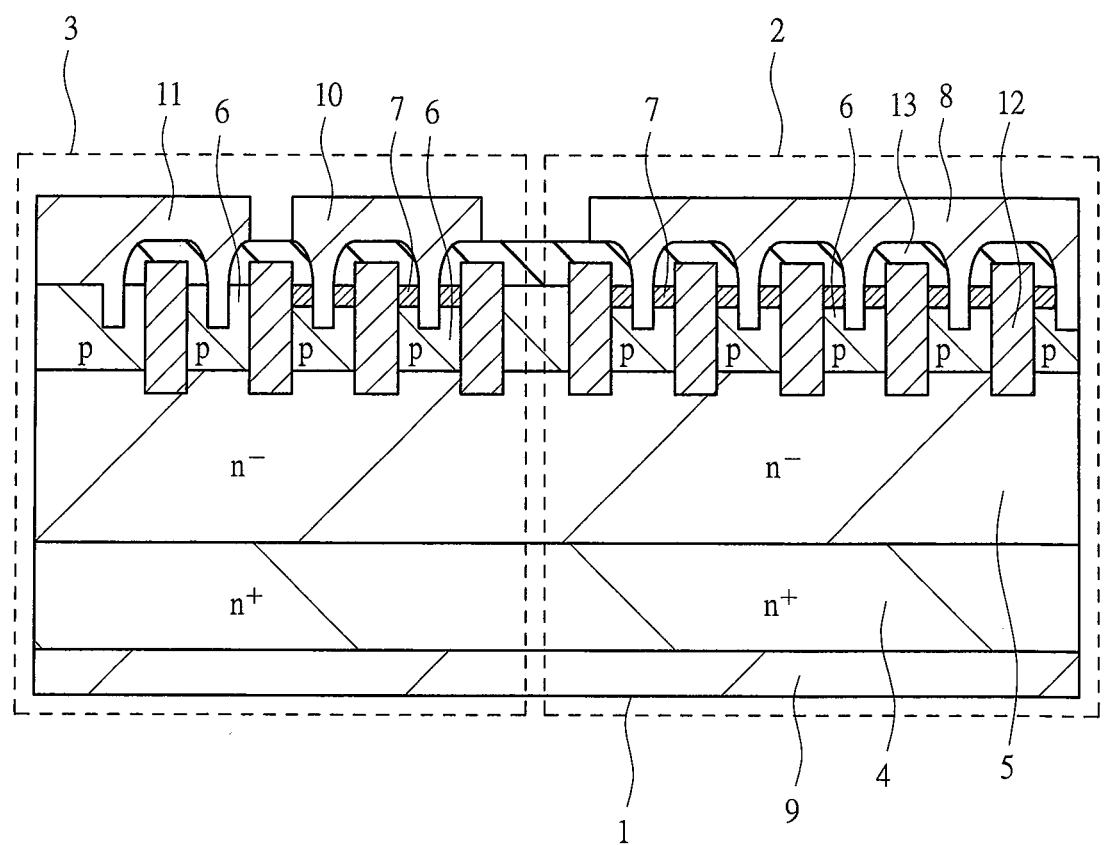
FIG. 1 is a cross-sectional view illustrating a configuration of a semiconductor substrate according to a first embodiment of the present invention.

With reference to FIG. 1, a configuration of a semiconductor substrate according to a first embodiment of the present invention will be described. FIG. 1 is a cross-sectional view illustrating a configuration of the semiconductor substrate according to the first embodiment of the present invention, illustrating a cross-sectional view of a trench-gate type MOSFET.

In FIG. 1, a semiconductor substrate (a semiconductor chip or a semiconductor device) 1 is formed of a main current region 2 and a current sensing region 3 that is a current detecting region. The main current region 2 is formed of an $n^+$-type semiconductor region 4 (drain), an $n^-$-type semiconductor region 5 that is a first semiconductor region, a p-type semiconductor region 6 (body) that is a second semiconductor region, an $n^+$-type semiconductor region 7 (source) that is a third semiconductor region, a source electrode 8 that is a second conductor, and a drain electrode 9.

The current sensing region 3 is formed of an $n^+$-type semiconductor region 4 (drain), an $n^-$-type semiconductor region 5, a p-type semiconductor region 6 (body), an $n^+$-type semiconductor region 7 (source), a MOSFET current detecting electrode 10 that is a third conductor, and a diode current detecting electrode 11 that is a fourth conductor.

In addition, trenches are formed in the $n^-$-type semiconductor region 5, the p-type semiconductor region 6 (body), and the $n^+$-type semiconductor region 7 (source), and gate electrodes 12 which are first conductors are formed on a gate insulator (not illustrated) formed in the trenches, as illustrated in FIG. 1.

Also, an insulating film 13 is formed between the gate electrode 12 and the source 8, the MOSFET current detecting electrode 10, and the diode current detecting electrode 11.

While the main current region 2 is similar to that in an existing trench-gate type MOSFET, the current sensing region 3 has a surface electrode being separated into the MOSFET current detecting electrode 10 and the diode current detecting electrode 11. In the current sensing region 3, the p-type semiconductor region 6 (body) and the $n^+$-type semiconductor region 7 (source) are provided to a portion with which the MOSFET current detecting electrode 10 is in contact, and only the p-type semiconductor region 6 (body) is provided to a portion with which the diode current detecting electrode 11 is in contact.

As the diode current detecting electrode 11 is in contact with the p-type semiconductor region 6 (body), the diode current detecting electrode 11 detects only the diode current. On the other hand, as the MOSFET current detecting electrode 10 is in contact with the p-type semiconductor region 6 (body) and the $n^+$-type semiconductor region 7 (source), the MOSFET current detecting electrode 10 detects a total value of the MOSFET current and the diode current.

Meanwhile, an aim of providing the MOSFET current detecting electrode 10 is to detect the through current of the MOSFET, and thus there is no problem in the detected amount being a total value of the MOSFET current and diode current.

Figure 2:
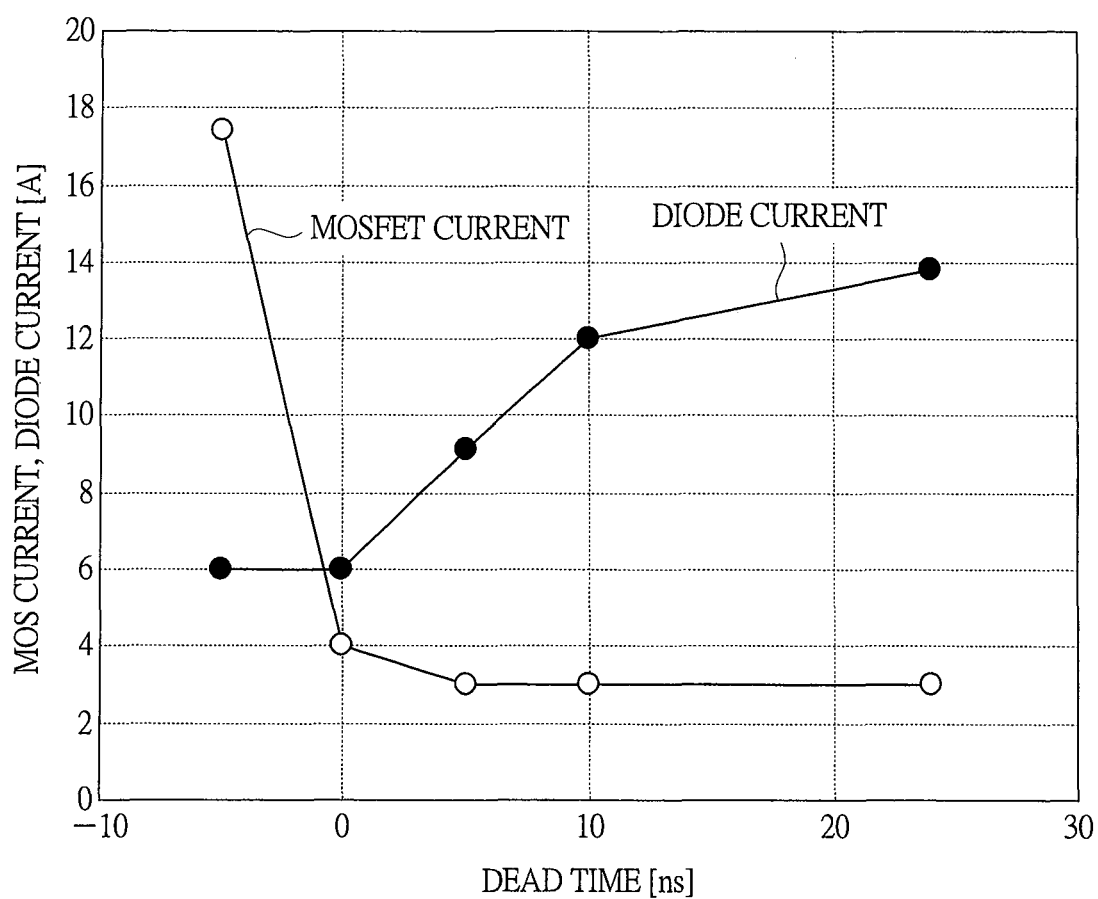
FIG. 2 is a diagram illustrating a relationship between dead time and current for describing an effect obtained by detecting operating current of a MOSFET and diode current by the semiconductor substrate according to the first embodiment of the present invention.
Figure 3:
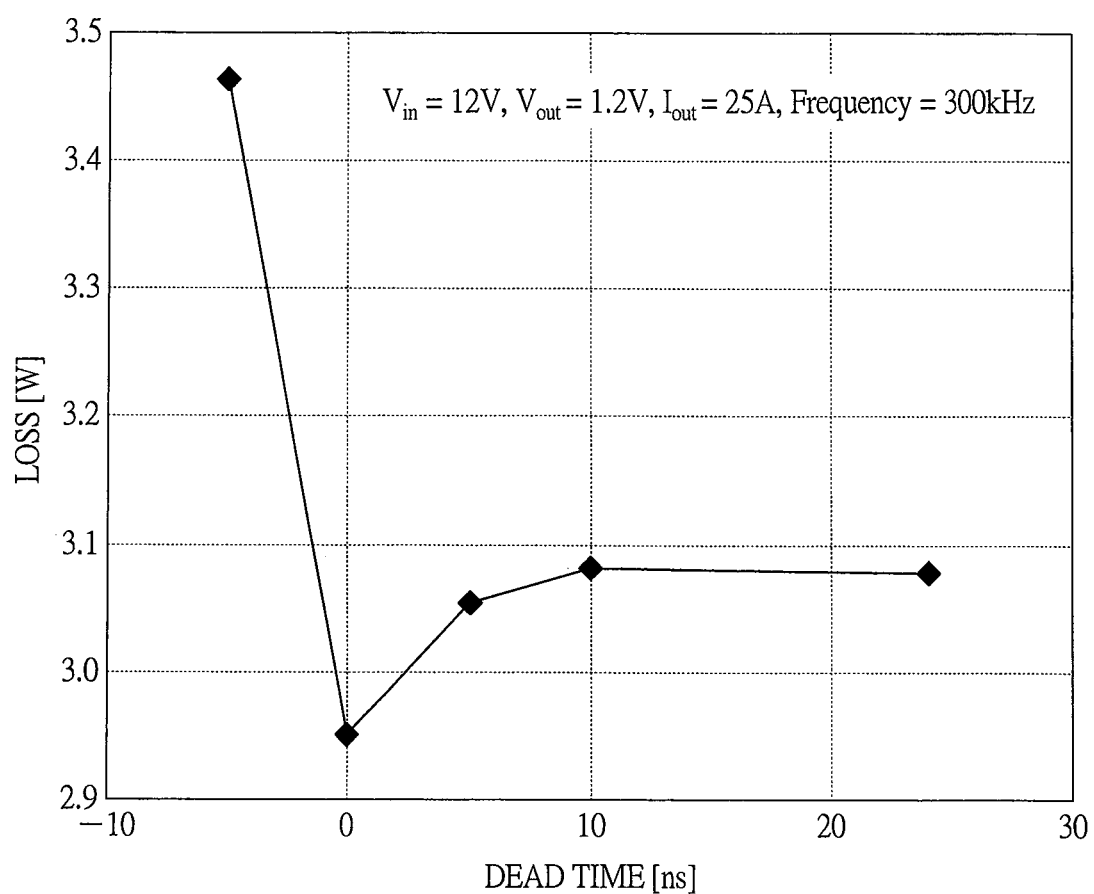
FIG. 3 is a diagram illustrating a relationship between dead time and power loss for describing an effect obtained by detecting operating current of a MOSFET and diode current by the semiconductor substrate according to the first embodiment of the present invention.
Figure 4:
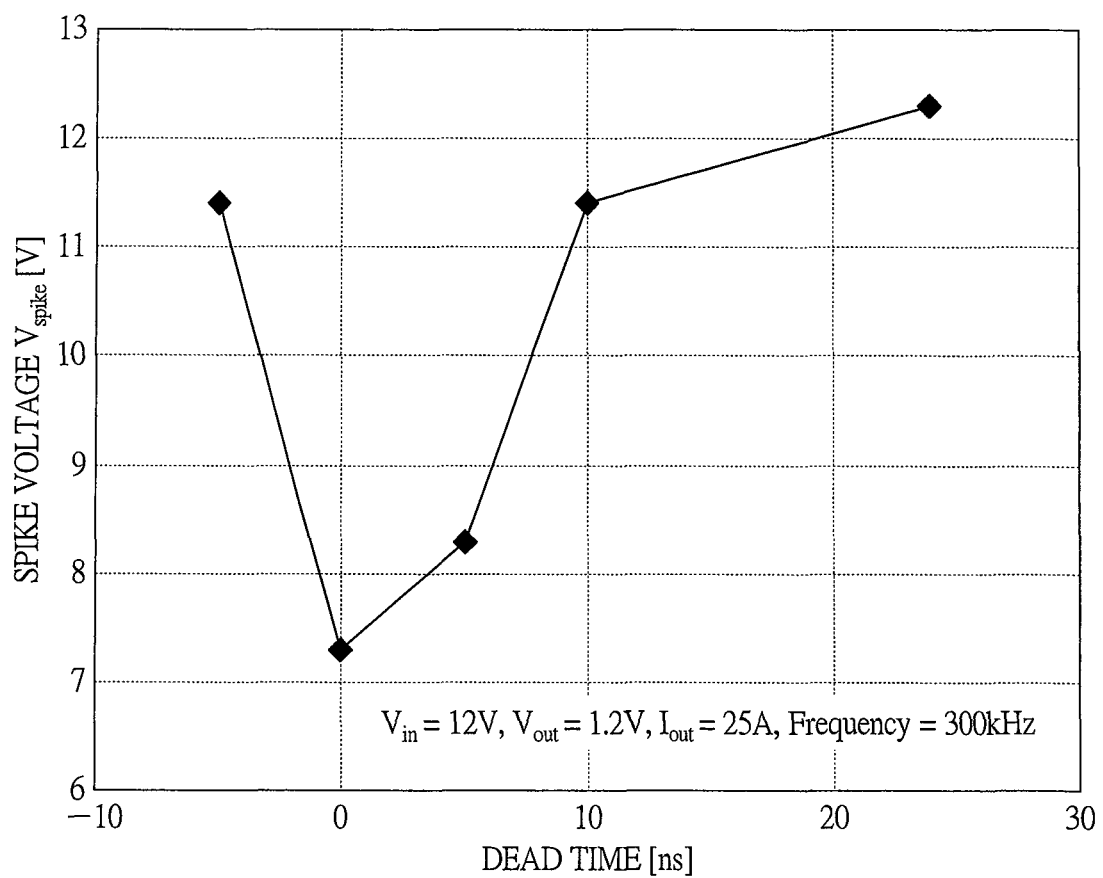
FIG. 4 is a diagram illustrating a relationship between dead time and spike voltage for describing an effect obtained by detecting operating current of a MOSFET and diode current by the semiconductor substrate according to the first embodiment of the present invention.

Next, with reference to FIGS. 2 to 4, effects of detecting the operating current of the MOSFET and the diode current by the semiconductor substrate according to the first embodiment of the present invention will be described. FIGS. 2 to 4 are explanatory diagrams for describing effects of detecting the operating current of the MOSFET and the diode current by the semiconductor substrate according to the first embodiment of the present invention, in which FIG. 2 is a diagram illustrating a relationship between dead time and current, FIG. 3 is a diagram illustrating a relationship between dead time and power loss, and FIG. 4 is a diagram illustrating a relation of dead time and spike voltage.

In FIG. 2, the horizontal axis is dead time, and the vertical axis is MOSFET current and diode current to be detected by the semiconductor substrate of the present embodiment, in which the MOSFET current is through current flowing in a direction from the drain to the source, and the diode current indicates recovery current flowing from a cathode to an anode.

Here, the dead time on the horizontal axis is a period in which the gate voltages of both of high-side and low-side MOSFETs in a switched-mode power supply device composed of the semiconductor substrate are off. As illustrated in FIG. 2, the diode current becomes smaller as the dead time becomes shorter, and the decrease of diode current is saturated when the dead time is 10 ns to 0 ns. A reason of the decrease in the recovery current of the diode when the dead time is 10 ns to 0 ns is that injection of holes which are minority carriers is decreased when the dead time is short.

The recovery current of the diode includes a component associated with the minority carrier and a component associated with a junction capacitance of a pn junction between the p-type semiconductor region 6 (body) and the n⁻-type semiconductor region 5. The component associated with the minority carrier can be reduced by shortening the dead time, but the component associated with the junction capacitance cannot be reduced. A reason of the saturation of the decrease in the recovery current of the diode when the dead time is smaller than or equal to 0 ns is that the component associated with the junction capacitance is dominant.

Also, while the through current of the MOSFET is suppressed to about 3 A when the dead time is 0 ns to 25 nm, the through current is abruptly increased when the dead time reaches −5 ns. This is because the high-side and low-side MOSFETs are turned on at the same time and thus large through current flows.

A reason of having the through current (about 3 A) of the MOSFET flowing even when the dead time is set to be sufficiently long is that the drain voltage of the low-side MOSFET is increased when the high-side MOSFET is turned on, increasing the gate voltage due to the capacitance coupling between the gate and drain and turning on the low-side MOSFET.

This phenomenon is called "self turn-on" or "false turn-on." There is a method of suppressing the "self turn-on" by reducing a turn-on speed of the high-side MOSFET or increasing a threshold voltage of the gate voltage of the low-side MOSFET.

Next, a method of optimizing the dead time using the recovery current of the body diode and the through current of the MOSFET will be described.

The method of optimizing the dead time is as follows.

(1) The dead time is gradually shortened from a sufficiently long dead time which does not allow the through current of the MOSFET to flow, and the recovery current of the diode and the through current of the MOSFET are detected.

(2) A range of dead time which makes the recovery current of the diode minimum is derived and dead time within the range at which the through current of the MOSFET does not abruptly increase is determined to be an optimum value.

According to the method of optimizing dead time as described above, in the example illustrated in FIG. 2, an optimum value of dead time is 0 ns.

However, the optimum value of dead time differs depending on types of MOSFETs and circuit conditions (input voltage, output current, temperature, etc.).

In addition, as illustrated in the diagram of FIG. 3 illustrating a relationship between dead time and power loss, by setting the dead time to an optimum value (0 ns), loss can be minimized.

Also, FIG. 4 illustrates a relationship between dead time and spike voltage, in which the spike voltage is a difference between surge voltage of the drain of the low-side MOSFET and input voltage (12 V) upon turning on the high-side MOSFET. By optimizing the dead time to 0 ns, the spike voltage can be minimum.

There are two merits in reducing the spike voltage.

(1) Noise reduction: Noise can be classified into two kinds, radiation noise and conduction noise, and this suppression of spike voltage reduces these two kinds of noise.

(2) Reduction of conduction loss of the MOSFET: As the spike voltage is lowered, a low-withstand-voltage MOSFET can be used, thereby reducing an on resistance of the MOSFET ($\propto$ conduction loss).

As described above, according to the present embodiment, operating current and diode current can be detected in a trench-gate type MOSFET, and thus it is possible to easily perform optimization of dead time.

Second Embodiment

A semiconductor substrate of a second embodiment has the MOSFET current detecting electrode 10 being in contact with only the n⁺-type semiconductor region 7 (source) in the semiconductor substrate of the first embodiment.

Figure 5:
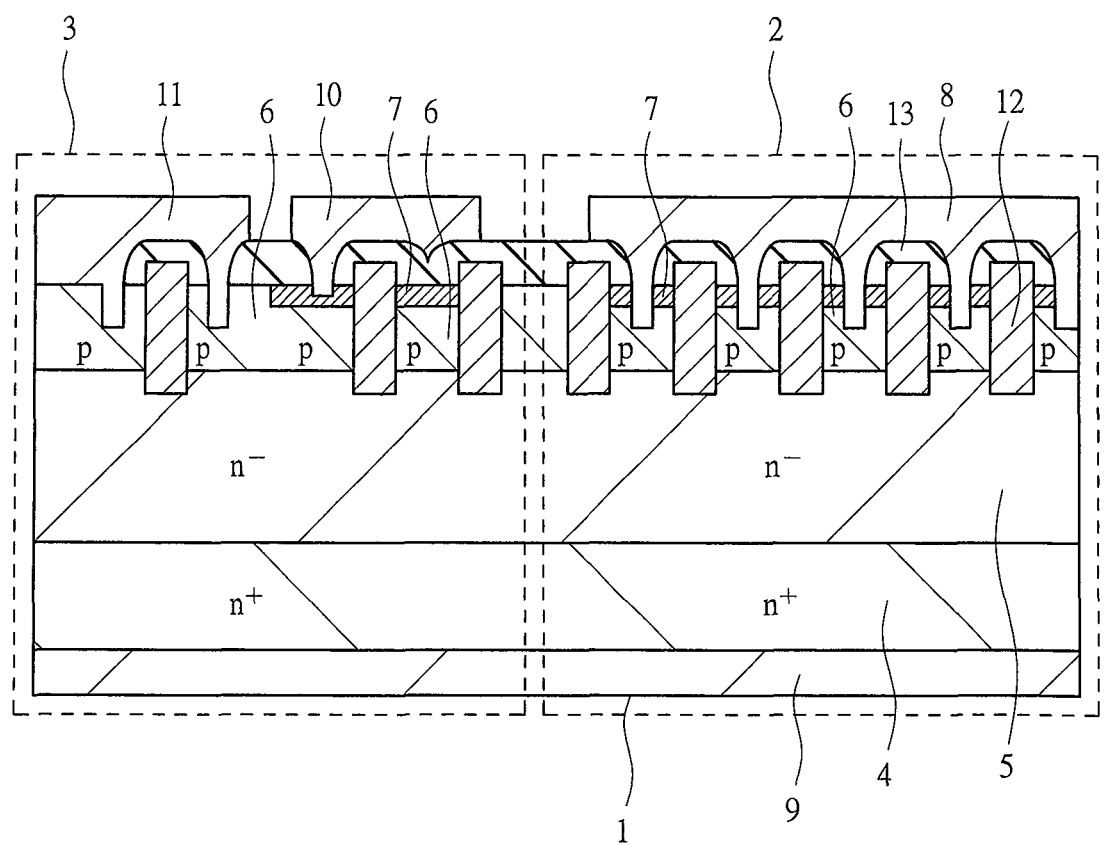
FIG. 5 is a cross-sectional view illustrating a configuration of a semiconductor substrate according to a second embodiment of the present invention.

With reference to FIG. 5, a configuration of the semiconductor substrate according to the second embodiment of the present invention will be described. FIG. 5 is a cross-sectional view illustrating a configuration of the semiconductor substrate according to the second embodiment of the present invention.

In FIG. 5, different points from the semiconductor substrate 1 illustrated in FIG. 1 of the first embodiment are the following two points.

(1) The MOSFET current detecting electrode 10 is in contact with only the n⁺-type semiconductor region 7 (source) and is not in contact with the p-type semiconductor region 6 (body).

Note that, as illustrated in FIG. 5, a part of the MOSFET current detecting electrode 10 is not in contact with the n⁺-type semiconductor region 7 (source) and it is because current does not flow even when the part of the MOSFET current detecting electrode 10 is in contact with the n⁺-type semiconductor region 7 (source).

(2) Interval of the gate electrodes 12 in the current sensing region 3 (interval of the gate electrodes 12 under the MOSFET current detecting electrode 10 and the diode current detecting electrode 11) is larger than interval of the gate electrodes 12 in the main current region 2.

In this manner, according to the second embodiment, by using the above-described structure, it is possible to completely separately detect the MOSFET current and the diode current. A method of optimizing dead time after detecting the MOSFET current and diode current is the same as that of the first embodiment.

Third Embodiment

In the first embodiment, a method of optimizing dead time by detecting the recovery current of the diode and current of the MOSFET has been described. Meanwhile, the high-side and low-side MOSFETs are switched at a high speed in a switching circuit in an actual switched-mode power supply device, and thus the currents immediately after turning on the high-side MOSFET have large fluctuation and it makes difficult to detect absolute values of the currents at high accuracy.

Therefore, according to the third embodiment, after converting the detected current values to voltages, the voltages are inputted to an operational amplifier via a low-pass filter so that influence of the current fluctuation is suppressed.

Figure 6:
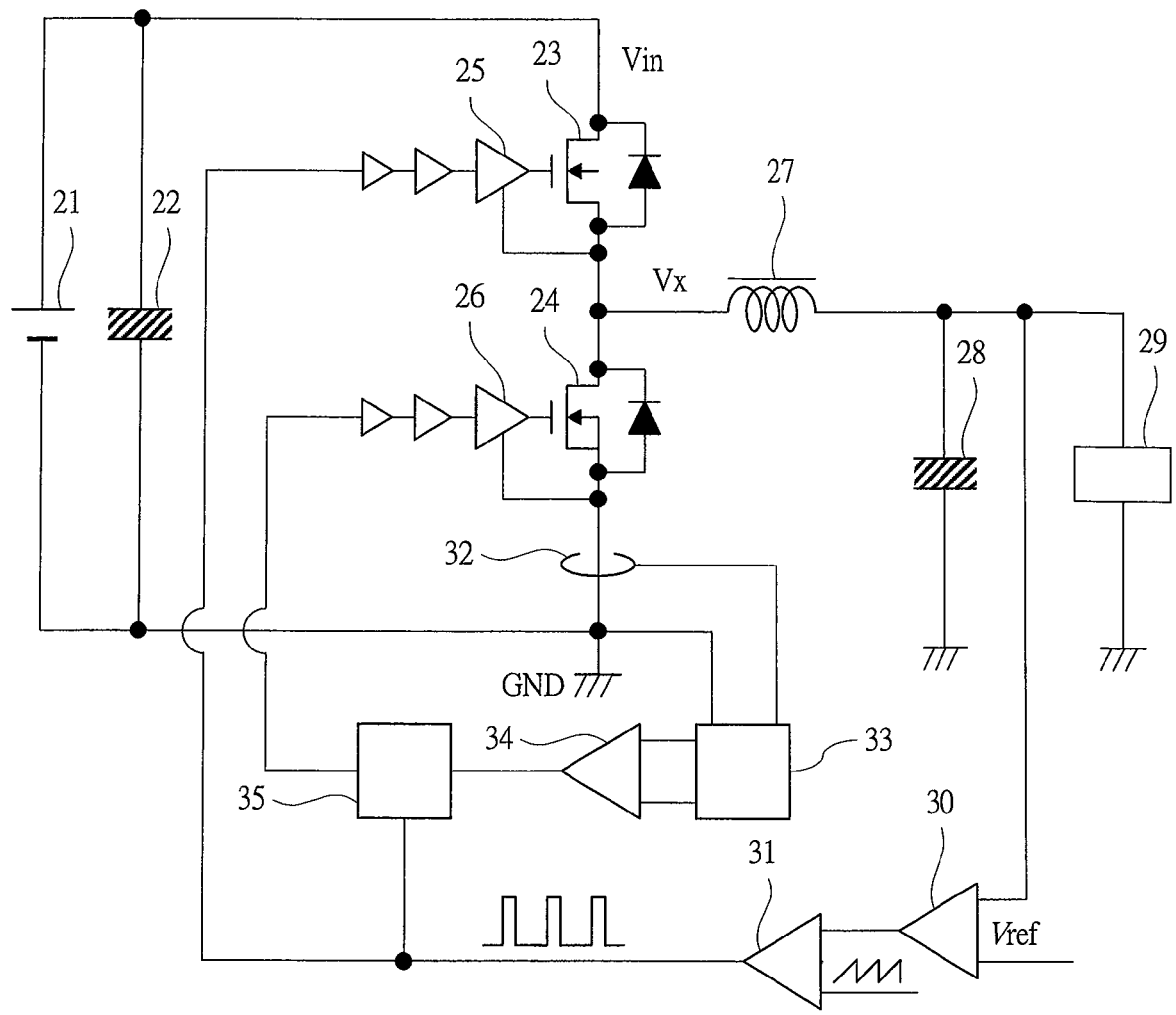
FIG. 6 is a circuit diagram illustrating a configuration of a switched-mode power supply device according to a third embodiment of the present invention using a semiconductor substrate.

With reference to FIG. 6, a configuration of a switched-mode power supply device according to the third embodiment using a semiconductor substrate of the present invention will be described. FIG. 6 is a circuit diagram illustrating the configuration of the switched-mode power supply device using a semiconductor substrate according to the third embodiment of the present invention.

In FIG. 6, the switched-mode power supply device is composed of an input power supply 21, an input capacitor 22, a high-side MOSFET 23, a low-side MOSFET 24, a gate driving circuit of high-side MOSFET 25, a gate driving circuit of low-side MOSFET 26, a choke coil 27, an output capacitor 28, load 29, an error amplifier 30, a PWM converter 31, a current detector of sensing MOSFET and sensing diode 32, a low-pass filter 33, an operational amplifier 34, and dead time detecting portion 35.

In FIG. 6, the low-side MOSFET 24 is composed of the main current region 2 of the semiconductor substrate 1 illustrated in FIG. 1, and the current detector of sensing MOSFET and sensing diode 32 is composed of the current sensing region 3 of the semiconductor substrate 1 illustrated in FIG. 1.

While an absolute value of the recovery current of the diode cannot be detected by inserting the low-pass filter 33, fluctuation of current can be suppressed and it is possible to optimize dead time by changes in current values as illustrated in FIG. 2 in accordance with output of the low-pass filter.

Fourth Embodiment

A fourth embodiment is a semiconductor device mounting the semiconductor substrate 1 of the first or second embodiments.

Figure 7:
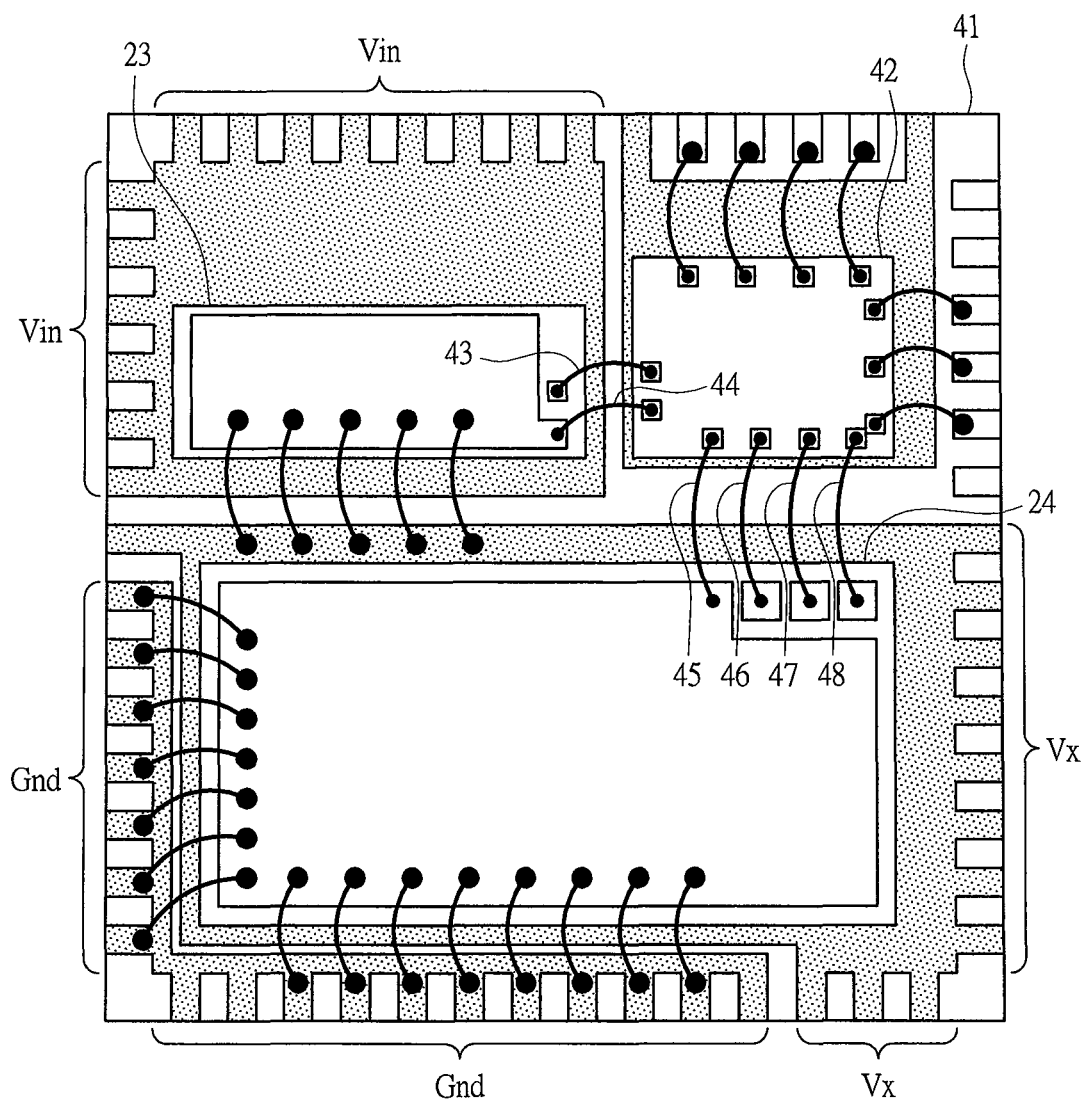
FIG. 7 is a plan view illustrating a configuration of a semiconductor device according to a fourth embodiment of the present invention mounting a semiconductor substrate.

With reference to FIG. 7, a configuration of a semiconductor device mounting a semiconductor substrate as a low-side MOSFET according to the fourth embodiment will be described. FIG. 7 is a plan view illustrating the semiconductor device mounting a semiconductor substrate according to the fourth embodiment of the present invention.

In FIG. 7, a semiconductor device 41 mounts the high-side MOSFET 23, the low-side MOSFET 24, and a driver IC 42 that is a driving device for driving these MOSFETs in one package, and is called a system in package (SiP).

The low-side MOSFET 24 is composed of the semiconductor substrate of the first or second embodiments.

In addition, to drive the gate of the high-side MOSFET 23, the driver IC 42 and the high-side MOSFET 23 are connected through two lines of a wire for gate 43 and a wire for source 44.

To the low-side MOSFET 24, a pad for source, a pad for gate, a pad for detecting current, and a pad for detecting body diode current are provided, and, via these pads, the low-side MOSFET 24 and the driver IC 42 are connected through a wire for sensing MOSFET 47 and a wire for sensing diode 48 in addition to a wire for gate 46 and a wire for source 45.

The wire for sensing MOSFET 47 and the wire for sensing diode 48 are connected to a resistor formed to the driver IC 42 in series, and current is detected by a voltage across both ends of the resistor. The detection of current by the resistor connected to the sensing MOSFET in series is described in Japanese Patent Application Laid-Open Publication No. 2009-75957 etc.

In the fourth embodiment, the low-side MOSFET 24 composed of the semiconductor substrate 1 of the first or second embodiments is mounted on the semiconductor device 41, and the wire for sensing MOSFET 47 and the wire for sensing diode 48 are connected to the driver IC 42. Therefore, it is possible to perform control by the driver IC 42 at good accuracy.

Therefore, it is possible to reduce loss and noise of the switched-mode power supply device by composing the switched-mode power supply device using the semiconductor device 41 of the fourth embodiment.

Fifth Embodiment

A fifth embodiment is a semiconductor device according to the fourth embodiment in which the wire for sensing MOSFET 47 and the wire for sensing diode 48 are connected to a lead frame terminal of the semiconductor device 41 and a current detection is performed outside the semiconductor device 41, and information of the current detection is inputted to the driver IC 42.

Figure 8:
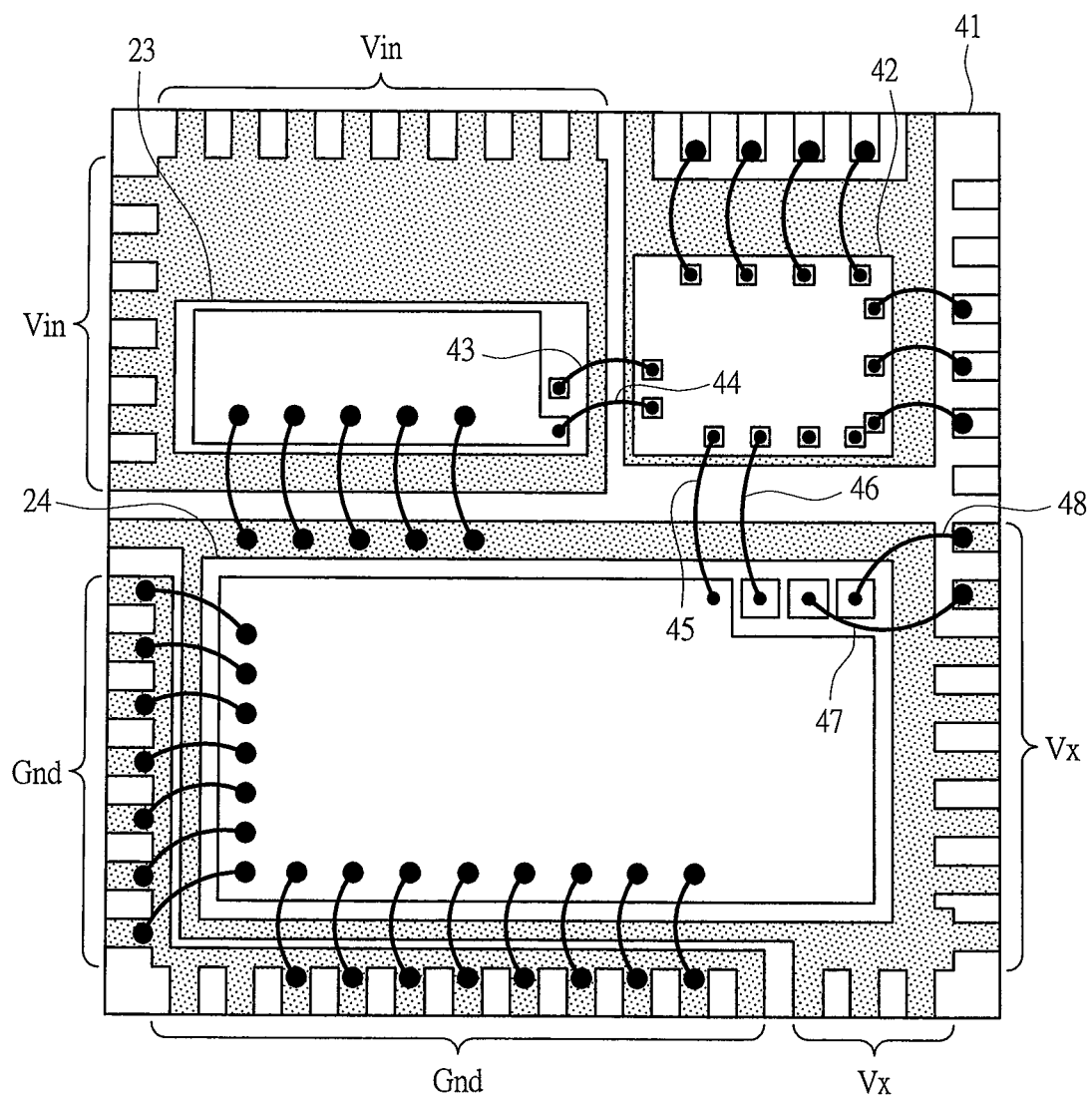
FIG. 8 is a plan view illustrating a configuration of a semiconductor device according to a fifth embodiment of the present invention mounting a semiconductor substrate.

With reference to FIG. 8, a configuration of the semiconductor device according to the fifth embodiment of the present invention mounting a semiconductor substrate as a low-side MOSFET will be described. FIG. 8 is a plan view illustrating the configuration of the semiconductor device mounting a semiconductor substrate according to the fifth embodiment of the present invention.

In FIG. 8, a different point from the semiconductor device in FIG. 7 of the fourth embodiment is that the wire for sensing MOSFET 47 and the wire for sensing diode 48 are connected to lead frame terminals of the semiconductor device 41. In addition, the driver IC 42 is connected to lead frame terminals for inputting information of a current detection from outside the semiconductor device 41.

As the fourth embodiment, when a resistor connected to the sensing MOSFET and sensing diode in series is formed to the driver IC 42, sometimes a resistor having high accuracy cannot be used. Meanwhile, as the fifth embodiment, when the wire for sensing MOSFET 47 and the wire for sensing diode 48 are connected to lead frame terminals and further connected to the resistor which is externally attached, a resistor having high accuracy externally attached can be used and thus it is possible to perform a current detection at high accuracy.

Sixth Embodiment

A sixth embodiment is a switched-mode power supply device using the semiconductor substrate of the first or second embodiments to a low-side MOSFET of the switched-mode power supply device.

Figure 9:
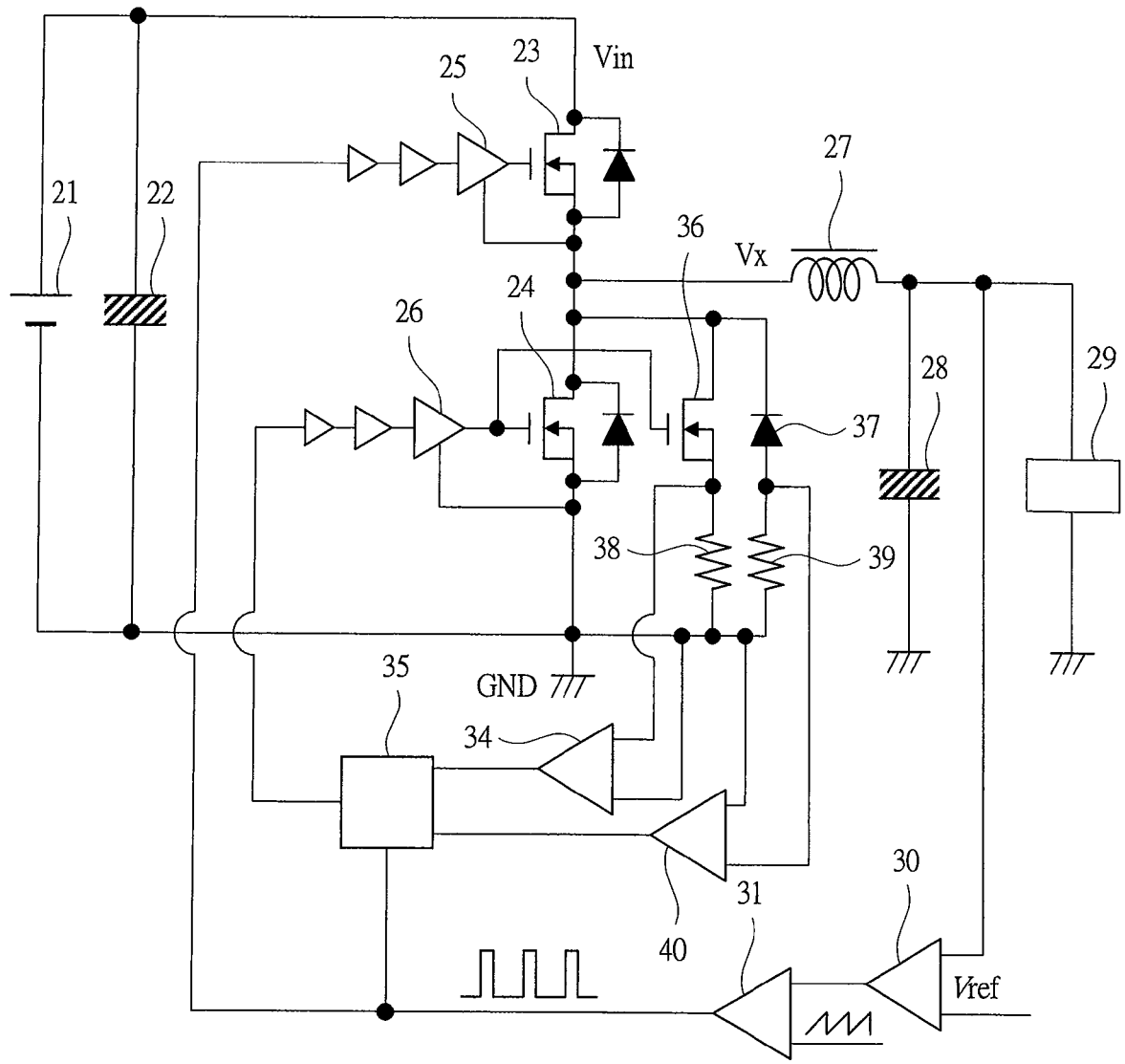
FIG. 9 is a circuit diagram illustrating a configuration of a switched-mode power supply device according to a sixth embodiment of the present invention using a semiconductor substrate.

With reference to FIG. 9, a configuration of the switched-mode power supply device according to the sixth embodiment using a semiconductor substrate will be described. FIG. 9 is a circuit diagram illustrating the configuration of the switched-mode power supply device according to the sixth embodiment using a semiconductor substrate.

In FIG. 9, the switched-mode power supply device is composed of the input power supply 21, the input capacitor 22, the high-side MOSFET 23, the low-side MOSFET 24, the gate driving circuit of high-side MOSFET 25, the gate driving circuit of low-side MOSFET 26, the choke coil 27, the output capacitor 28, the load 29, the error amplifier 30, the PWM converter 31, the dead time control portion 35, a current sensing MOSFET 36, a current sensing diode 37, current sensing resistors 38 and 39, and operational amplifiers 34 and 40.

In FIG. 9, the low-side MOSFET 24 is composed of the main current region 2 of the semiconductor substrate 1 illustrated in FIG. 1, and the current sensing MOSFET 36 and the current sensing diode 37 are composed of the current sensing region 3 of the semiconductor substrate 1 illustrated in FIG. 1.

In addition, areas of the current sensing MOSFET 36 and the current sensing diode 37 are as small as $1/1000$ or $1/10000$ of an area of the low-side MOSFET 24 in the main current region 2, and thus very small current flows in the current sensing MOSFET 36 and the current sensing diode 37 and loss due to the resistors 38 and 39 is small.

Then, voltages across both ends of the resistors 38 and 39 are detected and the dead time is controlled by the dead time control portion 35.

According to the sixth embodiment, as the semiconductor substrate 1 of the first or second embodiments is used to the low-side MOSFET of the switched-mode power supply device, and the current sensing MOSFET 36 and the current sensing diode 37 are composed of the current sensing region 3 of the semiconductor substrate 1, it is possible to perform a current detection at good accuracy, and reduction in loss and noise of the switched-mode power supply device can be achieved.

In the foregoing, the invention made by the inventor of the present invention has been concretely described based on the embodiments. However, it is needless to say that the present invention is not limited to the foregoing embodiments and various modifications and alterations can be made within the scope of the present invention.

For example, while the example of using the semiconductor substrate 1 of the first or second embodiments to the low-side MOSFET has been described in the fourth to sixth embodiments, current may be detected by using the semiconductor substrate 1 of the first or second embodiments to the high-side MOSFET.

The present invention relates to a semiconductor substrate and a semiconductor chip and is widely applicable to semiconductor substrates using a trench-gate type MOSFET and semiconductor devices mounting a semiconductor substrate.

What is claimed is:

1. A semiconductor device in one package comprising:
a first switching device;
a second switching device, the first switching device and the second switching device being connected in series between a voltage input terminal and a reference voltage terminal; and
a driving circuit that complementarily drives the first switching device and the second switching device,
wherein the second switching device is composed of a semiconductor substrate including:
a first semiconductor region on a main surface of a substrate,
a second semiconductor region formed in the first semiconductor region and having a conductivity opposite to that of the first semiconductor region,
a third semiconductor region formed in the second semiconductor region and having the same conductivity as the first semiconductor region,
a plurality of grooves formed in the first semiconductor region, the second semiconductor region, and the third semiconductor region and extending in a first direction on the main surface of the substrate,
a first insulating film formed in the grooves, and
a first conductor formed on the first insulating film,
wherein the semiconductor substrate has a main current region and a current detecting region in which current smaller than main current flowing in the main current region flows,
wherein the main current region has a second conductor disposed on a main surface of the main current region, the second conductor being in contact with the second semiconductor region and the third semiconductor region, and
wherein the current detecting region has a third conductor and a fourth conductor disposed on a main surface of the current detecting region, the third conductor being in direct contact with the second semiconductor region and the third semiconductor region, and the fourth conductor being in direct contact with the second conductor;
wherein the second switching device further includes at least four pads including a gate pad, a source pad, a current detecting pad, and a body diode current detecting pad,
wherein the gate pad, the source pad, the current detecting pad, and the body diode current detecting pad are connected to the first conductor, the second conductor, the third conductor, and the fourth conductor of the semiconductor substrate, respectively, and
wherein the driving circuit and the at least four pads are connected by bonding wires.

2. A semiconductor device in one package comprising:
a first switching device;
a second switching device, the first switching device and the second switching device being connected in series between a voltage input terminal and a reference voltage terminal; and
a driving circuit that complementarily drives the first switching device and the second switching device,
wherein the second switching device is composed of a semiconductor substrate including:
a first semiconductor region on a main surface of a substrate,
a second semiconductor region formed in the first semiconductor region and having a conductivity opposite to that of the first semiconductor region,
a third semiconductor region formed in the second semiconductor region and having the same conductivity as the first semiconductor region,
a plurality of grooves formed in the first semiconductor region, the second semiconductor region, and the third semiconductor region and extending in a first direction on the main surface of the substrate,
a first insulating film formed in the grooves, and
a first conductor formed on the first insulating film,
wherein the semiconductor substrate has a main current region and a current detecting region in which current smaller than main current flowing in the main current region flows,
wherein the main current region has a second conductor disposed on a main surface of the main current region, the second conductor being in contact with the second semiconductor region and the third semiconductor region, and
wherein the current detecting region has a third conductor and a fourth conductor disposed on a main surface of the current detecting region, the third conductor being in direct contact with the second semiconductor region and the third semiconductor region, and the fourth conductor being in direct contact with the second conductor;
wherein the second switching device further includes at least four pads including a gate pad, a source pad, a current detecting pad, and a body diode current detecting pad,
wherein the gate pad, the source pad, the current detecting pad, and the body diode current detecting pad of the second switching device are connected to the first conductor, the second conductor, the third conductor, and the fourth conductor of the semiconductor substrate, respectively, wherein the first switching device includes the semiconductor substrate and at least four pads including a gate pad, a source pad, a current detecting pad, and a body diode current detecting pad, wherein the gate pad, the source pad, the current detecting pad, and the body diode current detecting pad of the first switching device are connected to the first conductor, the second conductor, the third conductor, and the fourth conductor of the semiconductor substrate, respectively, and wherein the driving device and the at least four pads of each of the first switching device and the second switching device are connected by bonding wires.

3. The semiconductor device according to claim 1, wherein the driving device includes a first resistor connected to each of the detecting current pads and a second resistor connected to each of the body diode current detecting pads, detects voltages across both ends of the first resistor and the second resistor, and controls dead time of the first switching device and the second switching device.

4. The semiconductor device according to claim 3, wherein the driving device detects the voltages across both ends of the first resistor and the second resistor through a low-pass filter.

* * * * *